US009194893B2

(12) United States Patent
Chuah et al.

(10) Patent No.: US 9,194,893 B2
(45) Date of Patent: Nov. 24, 2015

(54) BI-DIRECTIONAL INPUT, BI-DIRECTIONAL OUTPUT, LOSSLESS CURRENT SENSING SCHEME WITH TEMPERATURE COMPENSATION

(71) Applicant: TEXAS INSTRUMENTS INCORPORATED, Dallas, TX (US)

(72) Inventors: Yew Tat Chuah, Singapore (SG); Zhao Tang, Beijing (CN); Wei Lu, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 30 days.

(21) Appl. No.: 13/990,377

(22) PCT Filed: Feb. 7, 2013

(86) PCT No.: PCT/CN2013/071505
§ 371 (c)(1),
(2) Date: May 29, 2013

(87) PCT Pub. No.: WO2014/121484
PCT Pub. Date: Aug. 14, 2014

(65) Prior Publication Data
US 2014/0375342 A1    Dec. 25, 2014

(51) Int. Cl.
*G01R 19/00* (2006.01)
*G01R 19/32* (2006.01)
*G01R 19/10* (2006.01)
*G01R 19/14* (2006.01)
*G01R 19/04* (2006.01)

(52) U.S. Cl.
CPC ............ *G01R 19/32* (2013.01); *G01R 19/0046* (2013.01); *G01R 19/0092* (2013.01); *G01R 19/10* (2013.01); *G01R 19/04* (2013.01); *G01R 19/14* (2013.01)

(58) Field of Classification Search
CPC .... G01R 19/32; G01R 19/10; G01R 19/0046; G01R 19/14; G01R 27/02; G01R 19/0092; G01R 27/16; G01R 21/00; G01R 1/203; G01R 19/00; G01R 31/40; G01R 1/44; G01R 33/0082; G01R 17/105; G01R 27/14; G01D 5/14; G01F 1/698; G01L 9/125; H03F 1/301; H03F 2200/471; H03F 3/16; H03F 2200/462; H03F 1/0277; H03F 2200/15; H03F 2200/24; H03F 2200/465; H03F 3/193; H01L 2924/1306; H01L 2924/13091; H01L 27/088; H01L 2924/14; H02M 2001/0009; G05F 1/10; G05F 3/245; G05F 3/262
USPC ................ 324/713, 515, 675, 682, 690, 522, 324/76.11, 123 R, 126, 225, 750.3; 318/471; 330/296, 297; 327/513
See application file for complete search history.

(56) References Cited

U.S. PATENT DOCUMENTS 4,553,084 A    11/1985 Wrathall
5,352,932 A    10/1994 Tihanyi
(Continued)

FOREIGN PATENT DOCUMENTS

CN          201159746         12/2008
DE          10240914 A1   *   3/2004
WO          WO 2012144864     10/2012

*Primary Examiner* — Melissa Koval
*Assistant Examiner* — Nasima Monsur
(74) *Attorney, Agent, or Firm* — Lawrence J. Bassuk; Alan A. R. Cooper; Frank D. Cimino

(57) ABSTRACT

A sensing circuit for a power FET. A first sensing FET senses current flow from load to ground. A second sensing FET senses current flow from ground to load. The current flows are converted to voltages, then added to generate a sensed output voltage. The specific amplitude of the sensed output voltage indicates the direction of the current flow. Resistive elements used to convert currents to voltages are configured as pairs of resistors having temperature coefficients of opposite polarity in order to compensate for temperature effects in the sensing circuit.

14 Claims, 5 Drawing Sheets

(56) References Cited

U.S. PATENT DOCUMENTS

| | | | |
|---|---|---|---|
| 5,815,027 A | 9/1998 | Tihanyi et al. | |
| 6,768,382 B1 * | 7/2004 | Shie et al. | 330/296 |
| 7,034,542 B2 * | 4/2006 | Peterson | 324/522 |
| 8,232,846 B1 * | 7/2012 | De Vita et al. | 331/111 |

* cited by examiner

US 9,194,893 B2

BI-DIRECTIONAL INPUT, BI-DIRECTIONAL OUTPUT, LOSSLESS CURRENT SENSING SCHEME WITH TEMPERATURE COMPENSATION

TECHNICAL FIELD

The present disclosure relates generally to current sensing for power FETs, and more particularly, to circuits and methods for sensing both amplitude and direction of a load current.

BACKGROUND

A power MOSFET or power FET is designed to handle significantly higher power levels than other semiconductor devices. However, such applications, for example, motor driver applications and DC/DC regulators, also demand a control scheme that provides information about the current flowing through the load.

Existing solutions for lossless current sensing of power FETs use either a single sense FET, or a direct measurement of the drain-source voltage $V_{DS}$ of the power FET. However, a direct measurement of the drain-source voltage $V_{DS}$ may not be accurate, particularly when the "on" channel resistance $R_{DSON}$ of the power FET is low. Further, using a single sense FET permits measuring current flow in only one direction (sink or source).

For example, FIG. 1 shows a circuit 55 having a power FET 60 with its drain coupled to the load, its source coupled to ground, and its gate coupled to a gate voltage $V_{gate}$. A sense FET 61 has its drain coupled to the inverting input of amplifier 70 and to the source of sense FET 62, its source connected to ground, and its gate coupled to the gate voltage $V_{gate}$. The load is also connected to the non-inverting input of amplifier 70, thus creating a feedback loop that maintains a stable current through sense FET 62. The gate of sense FET 62 is coupled to the output of amplifier 70, which drives the sense FET 62 to deliver a one-way current $I_{sns}$ through the channel of the sense FET 62 when current is flowing out of the load.

Therefore, it would be desirable to provide a way of detecting both amplitude and direction of the load current, as well as providing a voltage representation of the load current for processing.

DETAILED DESCRIPTION

The present disclosure is directed to sensing circuit for a power FET. In one embodiment, a first sensing FET is coupled to the power FET for sensing a current flow from the load to ground, and a second sensing FET is coupled to the power FET for sensing a current flow from ground to the load. The current flows are converted by resistors to voltages, and the voltages are added to yield a resultant output sensed voltage. The specific amplitude of the sensed output voltage also serves to indicate the direction of the current flow.

In one embodiment, pairs of resistors are configured with temperature coefficients of opposite polarities in order to compensate for temperature effects in the sensing circuit.

1. Current Sensing Circuit

Figure 1:
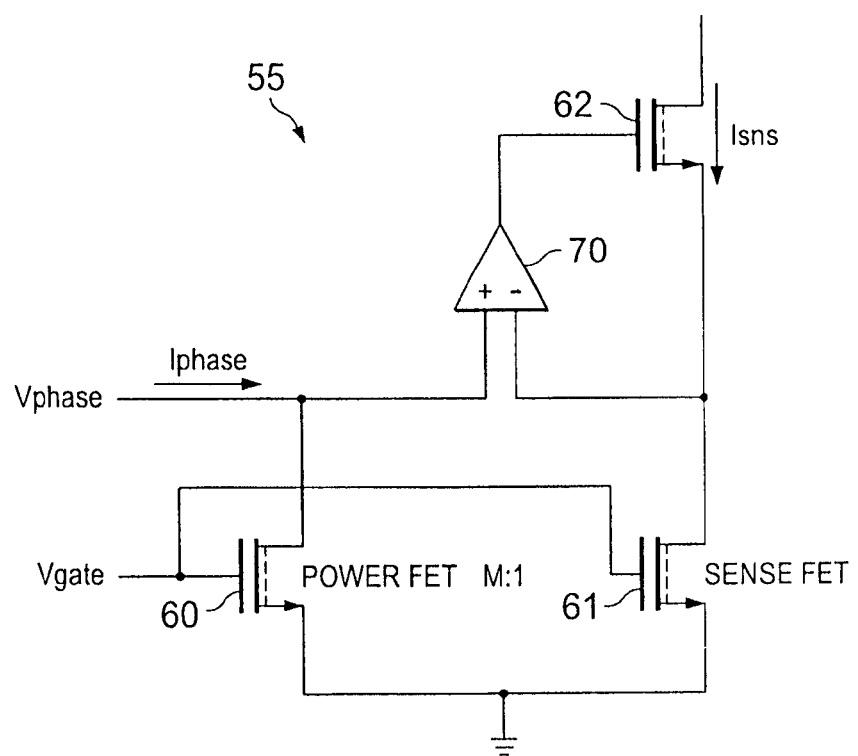
FIG. 1 is a circuit schematic for a conventional technique for sensing current flow in a power FET.
Figure 2:
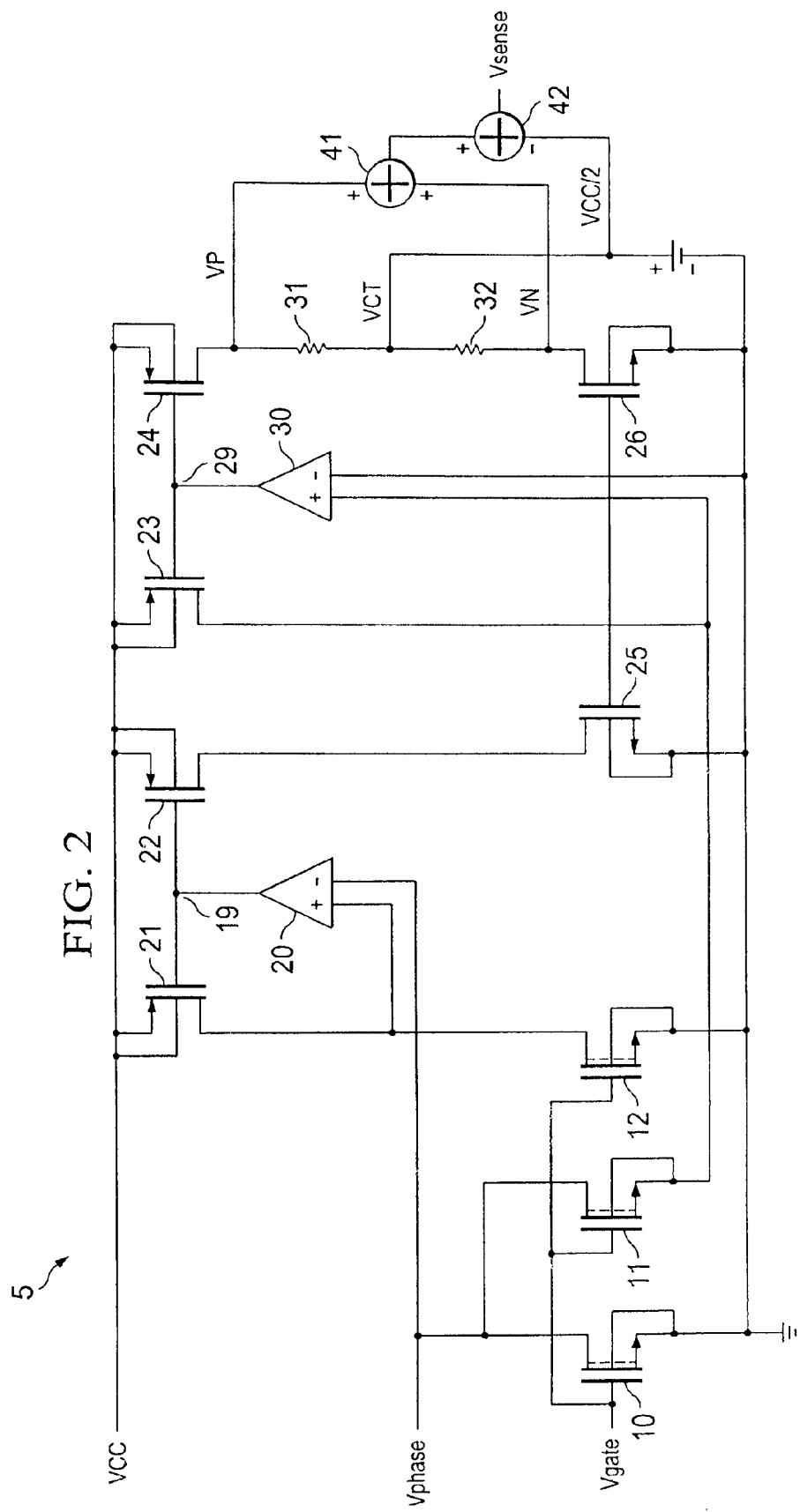
FIG. 2 is a circuit schematic for an improved technique for sensing current direction and amplitude in a power FET.

FIG. 2 shows a circuit 5 for low-side current sensing, for example, as used in a motor driver application. A similar circuit can be used for high-side sensing. The key components of the circuit are FET transistor 10, which is the low-side power MOSFET, and FET transistors 11 and 12, which are the corresponding sensing MOSFETs for the power FET. Eventually, the sensed current is converted to an output voltage at the $V_{sense}$ node.

The power FET 10 is an NMOS enhancement mode structure, with its source and substrate commonly coupled to ground, its drain coupled to one leg (phase) of the load voltage $V_{phase}$, and its gate coupled to a gate voltage $V_{gate}$. Sense FETs 11 and 12 are also NMOS enhancement mode structures. Sense FET 11 has its source and substrate commonly coupled to the non-inverting input (+) of operational amplifier 30, its drain coupled to the load voltage $V_{phase}$, and its gate coupled to the gate voltage $V_{gate}$. Sense FET 12 has its source and substrate commonly coupled to ground, its drain coupled to the non-inverting input (+) of operational amplifier 20, and its gate coupled to the gate voltage $V_{gate}$.

Transistors 21 and 22 form a first current mirror. The source and substrate of transistor 21 are coupled to the supply voltage $V_{CC}$, the drain is coupled to the non-inverting input of amplifier 20 (as well as the drain of sense FET 12), and the gate is commonly coupled to the gate of transistor 22 at node 19. The source and substrate of transistor 22 are also coupled to the supply voltage $V_{CC}$, the drain is coupled to the drain of transistor 25, and the gate is commonly coupled to the gate of transistor 21 at node 19.

Amplifier 20 has its non-inverting input coupled to the drain of transistor 21 and the drain of sense FET 12, the inverting input is coupled to the load voltage $V_{phase}$, and the output of amplifier 20 is coupled to the gates of transistors 21 and 22 at node 19.

Similarly, transistors 23 and 24 form a second current mirror. The source and substrate of transistor 23 are coupled to the supply voltage $V_{CC}$, the drain is coupled to the source of sense FET 11, and the gate is commonly coupled to the gate of transistor 24 at node 29. The source and substrate of transistor 24 are also coupled to the supply voltage $V_{CC}$, the drain is coupled to resistor 31 at node $V_P$, and the gate is commonly coupled to the gate of transistor 23 at node 29.

Amplifier 30 has its non-inverting input coupled to the drain of transistor 23 and the source of sense FET 11, the inverting input is coupled to the ground, and the output of amplifier 30 is coupled to the gates of transistors 23 and 24 at node 29.

Transistors 25 and 26 form a third current mirror. Transistor 25 has its drain coupled the drain of transistor 22, its source and substrate commonly coupled to ground, and its gate coupled to transistor 26. Transistor 26 has its drain coupled to resistor 32 at node $V_N$, its source and substrate commonly coupled to ground, and its gate coupled to transistor 25.

A voltage source $V_{CC}/2$ is connected between ground and node VCT between resistors 31 and 32. The positive source $V_{CC}/2$ is connected to the negative terminal of subtractor 42, and the output of adder 41 is connected to the positive terminal of the subtractor 42. The output of the subtractor 42 is the ultimate output voltage $V_{sense}$. An adder 41 is connected between node $V_P$ and node $V_N$.

2. Current Flowing Out of Load

When current is flowing out of the load, the potential at $V_{phase}$ is greater than ground. Thus, when the power FET 10 turns on, current $I_0$ flows from the motor phase (load terminal) through power FET 10 to ground. The flow of current $I_0$ throughout the circuit 5 is indicated by the arrows in FIG. 3A.

Amplifier 20 forces the drain of sense FET 12 to be equal to that of power FET 10 through the negative feedback loop. Since the gates of power FET 10 and sense FET 12 are connected together to $V_{gate}$, and the sources are also connected together (ground), the gate-source voltage $V_{GS}$ and drain-source voltage $V_{DS}$ voltage for the power FET 10 and the sense FET 12 are identical. Under these conditions, the current $I_2$ through sense FET 12 is proportional to the current $I_0$ through power FET 10, and the ratio between these currents is dependent on the physical size (W/L) of these two transistors, provided that the power FET 10 and the sense FET 12 operate in the triode region. The following equations define $I_0$ and $I_2$:

$$I_0 = \frac{1}{2}\mu_n C_{ox} \frac{W_0}{L_0}[2(V_{GS} - V_t)V_{DS} - V_{DS}^2] \quad (1.a)$$

$$I_2 = \frac{1}{2}\mu_n C_{ox} \frac{W_2}{L_2}[2(V_{GS} - V_t)V_{DS} - V_{DS}^2] \quad (1.b)$$

Since the load voltage $V_{phase}$ is greater than ground, and the gate voltage $V_{gate}$ is high enough to turn on FETs 11, 12 and 13, the source voltage of sense FET 11 will try to be close to the load voltage $V_{phase}$, but will be limited by the gate voltage $V_{gate}$. The result is that the output of operational amplifier 30 will saturate to rail voltage $V_{CC}$ due to negative feedback. This in turn disables the current mirror pair of transistors 23 and 24. Thus, the sense current $I_2$ is mirrored all the way until transistor 26, while there is no sense current $I_1$ being mirrored, i.e., sense current $I_1$=0.

The node VCT is a "neutral point" or "virtual ground" whose voltage level is conveniently chosen as half the supply voltage $V_{CC}$ or $V_{CC}/2$. Thus, the voltage potential at nodes $V_N$ and $V_P$ are given by the following equations, where $R_1$ refers to resistor 31 and $R_2$ refers to resistor 32:

$$V_P = \frac{VCC}{2} + I_1 R_1 = \frac{VCC}{2} \quad (2.a)$$

$$V_N = \frac{VCC}{2} - I_2 R_2$$

3. Current Flowing into Load

Similarly, when current is flowing into the load, it flows through power FET 10 from ground. In a motor drive application, this typically happens in the case of recirculation where the motor phase voltage $V_{phase}$ is lower than ground. The flow of current $I_0$ throughout the circuit 5 is indicated by the arrows in FIG. 3B.

Amplifier 30 forces the source-drain voltage $V_{DS}$ of sense FET 11 to be equal to that of the power FET 10. Thus, sense current $I_1$ is a scaled version of sense current $I_0$ and is mirrored all the way out at transistor 24. Using the same reasoning as before, the sense current $I_2$ is zero since the load voltage $V_{phase}$ is less than ground and will disable the current mirror pair transistors 21 and 22. Thus, the voltage potential at nodes $V_P$ and $V_N$ is given by the following equations:

$$V_P = \frac{VCC}{2} + I_1 R_1 \quad (2.b)$$

$$V_N = \frac{VCC}{2} - I_2 R_2 = \frac{VCC}{2}$$

4. Voltage Output

The node voltages $V_N$ and $V_P$ are converted to the final output voltage $V_{sense}$ through adder 41 and subtractor 42. The equation for determining the output voltage $V_{sense}$ is:

$$\begin{aligned} V_{sense} &= V_P + V_N - VCT \\ &= VCT + I_1 R_1 + VCT - I_2 R_2 - VCT \\ &= VCT + I_1 R_1 - I_2 R_2 \end{aligned} \quad (3.a)$$

Figure 3A:
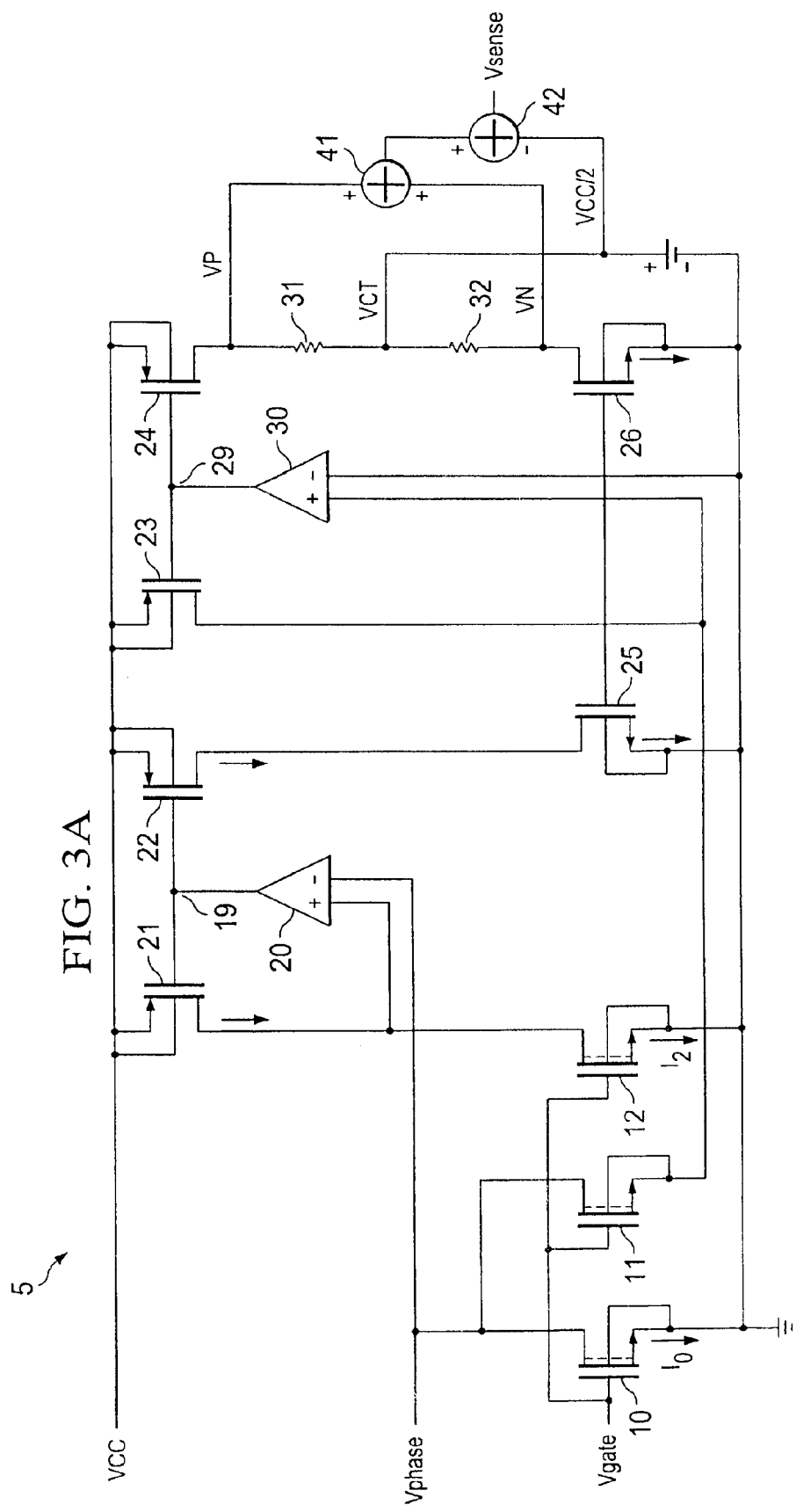
FIG. 3A is the circuit schematic of FIG. 2 showing current flow out of the load.

When the power FET 10 is drawing current from the load $V_{phase}$, the direction of the sense current is as shown in FIG. 3A. In this circumstance, there is no current developed in transistor 11, transistor 23 and transistor 24 ($I_1$=0), thus node $V_P$ remains at voltage VCT (which is equal to $V_{CC}/2$), and the sense voltage $V_{sense}$ equals VCT–$I_2R_2$.

Similarly, when current flows in the opposite direction, no current is developed in sense FET 12 ($I_2$=0), and the voltage at node $V_N$ remains at VCT (VCC/2), and thus the sense voltage $V_{sense}$ equals VCT+$I_1R_1$.

Figure 3B:
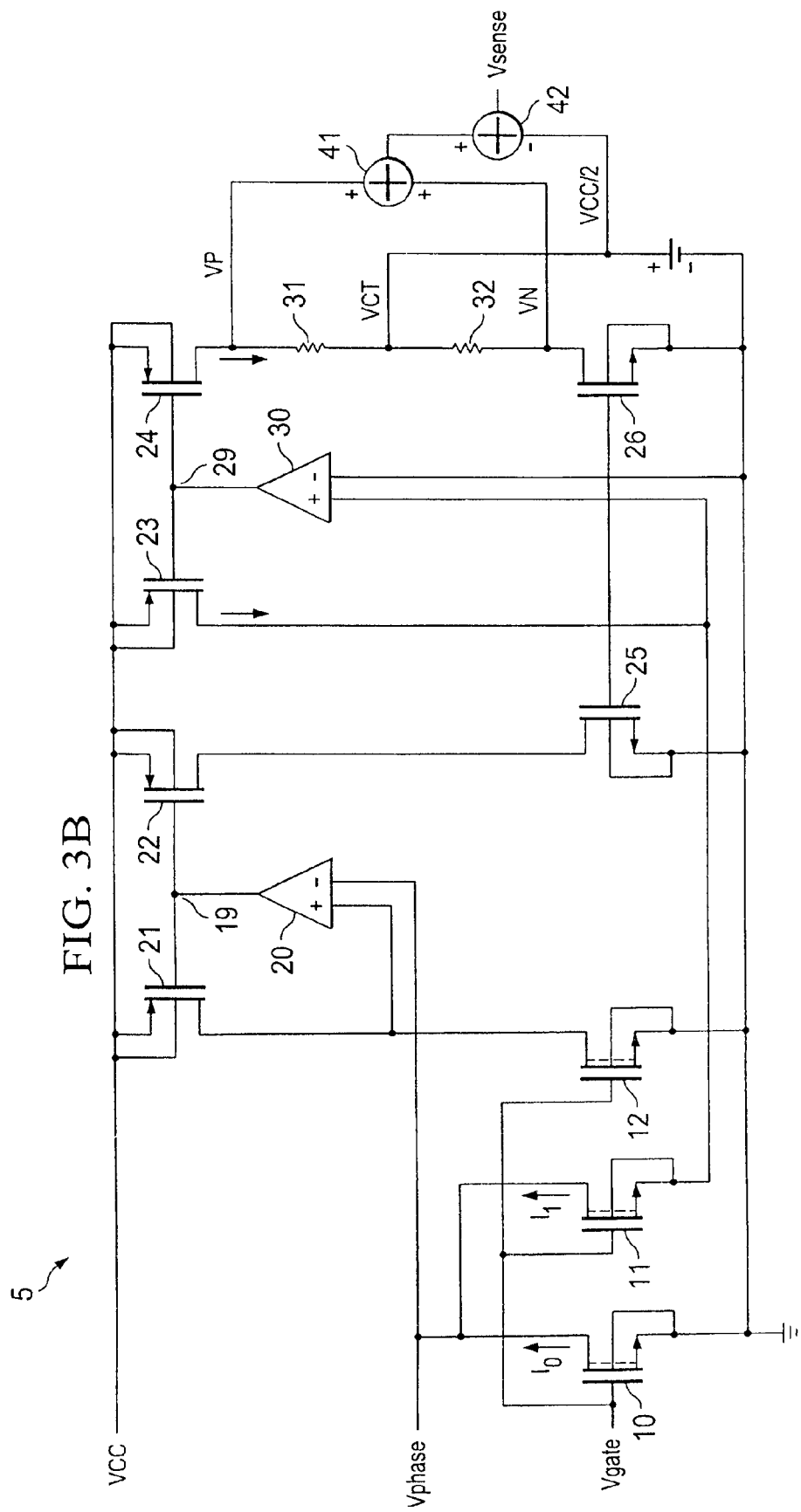
FIG. 3B is the circuit schematic of FIG. 2 showing current flow into the load.

If the current direction shown in FIG. 3B (injecting current into the load) is defined as the "positive" current direction (and the direction shown in FIG. 3A is then the "negative" current direction), and the ratio of width to length between FETs 10, 11 and 12 is assumed to be N:1:1, and the relationship assumed between the resistors is $R_1$=$R_2$=R, then currents $I_0$, $I_1$ and $I_2$ should follow the following equations:

$$I_0 : I_1 = N : 1 \quad (4.a)$$

$$I_0 : I_2 = (-N) : (-1) \quad (4.b)$$

Equation 3.a can then be rewritten as equation 3.b below:

$$V_{sense} = VCT + \frac{I_0}{N} R \quad (3.b)$$

For example, suppose the circuit is designed such that VCT=1.65V, N=2000, and R=1 kΩ. If current equaling 1 A is injected into the load as shown in FIG. 3B, the sense voltage $V_{sense}$ is 2.15V. When there is no current from/to the load, the sense voltage $V_{sense}$ is 1.65V. When current is drawn from the load as shown in FIG. 3A, the sense voltage $V_{sense}$ is 1.15V. In this way, the current direction and the current amplitude are both reflected at the final output point $V_{sense}$.

5. Temperature Compensation Resistor

Figure 4:
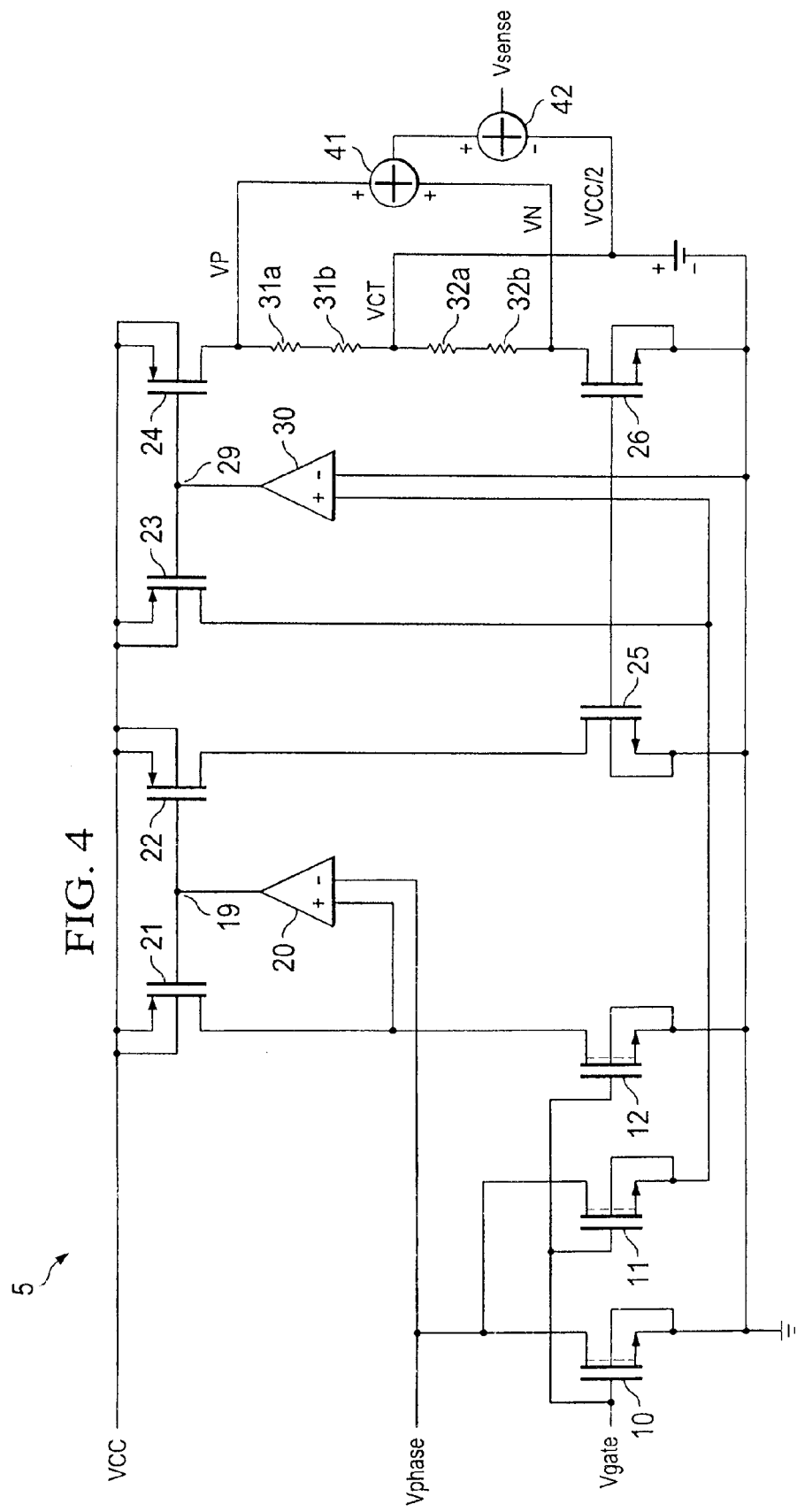
FIG. 4 is the circuit schematic of FIG. 2 showing the resistive elements replaced by series pairs of resistors.

A drawback of this sensing scheme is the use of resistors 31 and 32 for current-to-voltage conversion. Resistors usually have a very large temperature coefficient, and this may introduce an offset at the final $V_{sense}$ output when temperature changes, even though the sensed and mirrored current at transistor 24 or transistor 26 is very accurate. A simple solution to reduce the temperature impact on the output $V_{sense}$ is to replace each resistor 31, 32 with a pair of resistors in series, the series resistors having temperature coefficients of opposite polarities to cancel out the variation in resistance, This is shown in FIG. 4, which is identical to FIGS. 2-3, except that resistors 31a and 31b in series replace resistor 31, and resistors 32a and 32b in series replace resistor 32.

Temperature impact on resistors can be modeled by the equation below:

$$R = R_0 + (T-27)\left(\frac{TC_1}{10^6}\right)R_0 + (T-27)^2\left(\frac{TC_2}{10^6}\right)R_0 \quad (5)$$

where $TC_1$ is the linear temperature coefficient defined in ppm/° C., and $TC_2$ is the quad temperature coefficient defined in ppm/° C.². Performing differentiation on both sides with respect to T yields the following equation:

$$\frac{dR}{dT} = \frac{d}{dT}\left(R_0 + (T-27)\left(\frac{TC_1}{10^6}\right)R_0 + (T^2 - 54T + 27^2)\left(\frac{TC_2}{10^6}\right)R_0\right) \quad (6)$$

$$= \left(\frac{TC_1}{10^6}\right)R_0 + 2T\left(\frac{TC_2}{10^6}\right)R_0 - 54\left(\frac{TC_2}{10^6}\right)$$

In order to minimize the resistance variation throughout a temperature range, the ideal case is dR/dT=0. In order to achieve this, two different types of resistors with temperature coefficients of opposite polarities can be used in series with each other, as shown in FIG. 4. Assuming the resistor R in equation (5) above is divided into two different resistors $R_a$ and $R_b$, the following equations result:

$$R = R_a + R_b \quad (7)$$

$$= \left\{R_{0,a} + (T-27)\left(\frac{TC_{1,a}}{10^6}\right)R_{0,a} + (T-27)^2\left(\frac{TC_{2,a}}{10^6}\right)R_{0,a}\right\} +$$

$$\left\{R_{0,b} + (T-27)\left(\frac{TC_{1,b}}{10^6}\right)R_{0,b} + (T-27)^2\left(\frac{TC_{2,b}}{10^6}\right)R_{0,b}\right\}$$

$$\frac{dR}{dT} = \frac{d}{dT}(R_a + R_b) \quad (8.a)$$

$$= \left\{\left(\frac{TC_{1,a}}{10^6}\right)R_{0,a} + 2T\left(\frac{TC_{2,a}}{10^6}\right)R_{0,a} - 54\left(\frac{TC_{2,a}}{10^6}\right)\right\} +$$

$$\left\{\left(\frac{TC_{1,b}}{10^6}\right)R_{0,b} + 2T\left(\frac{TC_{2,b}}{10^6}\right)R_{0,b} - 54\left(\frac{TC_{2,b}}{10^6}\right)\right\}$$

In a first order analysis, $TC_2$ can be assumed to be much smaller than $TC_1$ and thus ignored. Thus, equation (8.a) can be rewritten as equation (8.b):

$$\frac{dR}{dT} \approx \left(\frac{TC_{1,a}}{10^6}\right)R_{0,a} + \left(\frac{TC_{1,b}}{10^6}\right)R_{0,b} \quad (8.b)$$

Substituting dR/dT=0 in equation (8.b) yields the following equation:

$$\left(\frac{TC_{1,a}}{10^6}\right)R_{0,a} + \left(\frac{TC_{1,b}}{10^6}\right)R_{0,b} = 0 \quad (9)$$

$$\Rightarrow \frac{R_{0,b}}{R_{0,a}} = -\frac{TC_{1,a}}{TC_{1,b}}$$

Thus, resistor 31 is implemented as a pair of two different resistors 31a and 31b having opposite polarities, and resistor 32 is implemented as a pair of two different resistors 32a and 32b having opposite polarities. Ideally, the absolute value of the temperature coefficient for each pair of resistors would be the same, but in reality, it is very difficult to obtain two resistors having the same temperature coefficient but opposite polarities.

While one or more implementations have been described by way of example and in terms of the specific embodiments, it is to be understood that one or more implementations are not limited to the disclosed embodiments. To the contrary, this disclosure is intended to cover various modifications and similar arrangements as would be apparent to those skilled in the art. Therefore, the scope of the appended claims should be accorded the broadest reasonable interpretation so as to encompass all such modifications and similar arrangements.

The invention claimed is:

1. A circuit for sensing current amplitude and direction, comprising:
    a power FET coupled to a load;
    a first sense FET coupled to the power FET and configured to sense a first current flow from the load to ground;
    a second sense FET coupled to the power FET and configured to sense a second current flow from ground to the load;
    a temperature compensation network coupled to the first and second current flows, wherein the temperature compensation network is a resistive network,
    wherein the resistive network converts the first and second current flows to first and second voltages, respectively; and
    an adder circuit coupled to the resistive network for summing voltages.

2. The circuit of claim 1, wherein the resistive network includes at least two resistors in series coupled to each current flow, the two resistors in series having temperature coefficients of opposite polarities.

3. The circuit of claim 1, further comprising:
    a first amplifier having an inverting input coupled to ground and a non inverting input coupled to a source of the second sense FET; and
    a second amplifier having an inverting input coupled to the load and a non inverting input coupled to the drain of the first sense FET.

4. The circuit of claim 3, further comprising:
    a first current mirror coupled to an output of the first amplifier; and
    a second current mirror coupled to an output of the second amplifier.

5. The circuit of claim 4, further comprising:
    a resistive network having a first pair of resistors in series coupled to the first current mirror and a second pair of resistors in series coupled to the second current mirror, wherein the resistors in each pair of resistors have temperature coefficients of opposite polarity, and wherein the resistive network converts the first and second current flows into first and second voltages, respectively.

6. The circuit of claim 5, further comprising:
    an adder circuit coupled to the resistive network for summing the first and second voltages.

7. A circuit for sensing current amplitude and direction in a load, comprising:
    a power FET having a drain coupled to the load, a source and a substrate commonly coupled to ground, and a gate coupled to a gate voltage;
    a first sense FET having a drain coupled to a first reference input, a source and a substrate commonly coupled to ground, and a gate coupled to the gate voltage, such that the first sense FET senses a first current flow from the load to ground;
    a second sense FET having a drain coupled to the load, a source and a substrate commonly coupled to a second reference input, and a gate coupled to the gate voltage, such that the second sense amplifier senses a second current flow from ground to the load;
a first amplifier having an inverting input coupled to ground and a non inverting input coupled to the source of the second sense FET;
a second amplifier having an inverting input coupled to the load and a non inverting input coupled to the drain of the first sense FET;
a first current mirror coupled to an output of the first amplifier;
a second current mirror coupled to an output of the second amplifier; and
a resistive network coupled to the first and second current flows for converting the current flows to voltages and for providing temperature compensation.

8. The circuit of claim 7, wherein:
the first current mirror includes a first mirror FET and a second mirror FET, the first mirror FET having a gate coupled to a reference voltage, a source and a substrate coupled to the reference voltage, and a drain coupled to the source of the second sense FET, and the second mirror FET having a gate coupled to a reference voltage, a source and a substrate coupled to the reference voltage, and a drain coupled to the resistive network; and
the second current mirror includes a third mirror FET and a fourth mirror FET, the third mirror FET having a gate coupled to a reference voltage, a source and a substrate coupled to the reference voltage, and a drain coupled to the drain of the first sense FET, and the fourth mirror FET having a gate coupled to a reference voltage, a source and a substrate coupled to the reference voltage, and a drain coupled to a first output FET.

9. The circuit of claim 8, further comprising:
the resistive network having a first resistive element and a second resistive element, the first resistive element having a first terminal coupled to the drain of the second mirror FET and a second terminal coupled to a first terminal of the second resistive element, the second resistive element having a second terminal coupled to a drain of a second output FET, wherein the first resistive element is a first pair of resistors in series and the second resistive element is a second pair of resistors in series, wherein the resistors in each pair of resistors have temperature coefficients of opposite polarity;
the first and second output FETs forming a third current mirror, the first output FET having a drain coupled to the drain of the fourth mirror FET, a source coupled to ground, and a gate coupled to the gate of the second output FET; and the second output FET having a drain coupled to the second terminal of the second resistive element, a source coupled to ground, and a gate coupled to the gate of the first output FET.

10. The circuit of claim 9, further comprising:
an adder coupled between the first terminal of the first resistive element and the second terminal of the second resistive element.

11. A method for sensing current amplitude and direction of a power FET coupled to a load, comprising:
coupling a first sense FET to the power FET and configuring the first sense FET to sense a first current flow from the load to ground;
coupling a second sense FET to the power FET and configuring the second sense FET to sense a second current flow from ground to the load;
converting the first and second current flows to first and second voltages, respectively, by a resistive network; and
adding the first and second voltages to determine a sensed voltage.

12. The method of claim 11, further comprising compensating for temperature effects in the resistive network.

13. The method of claim 12, wherein the resistive network has at least two resistive elements, including a first resistive element having a first pair of resistors in series and a second resistive element having a second pair of resistors in series, wherein the resistors in each pair of resistors have temperature coefficients of opposite polarity.

14. The method of claim 11, wherein the step of configuring the first sense FET includes coupling a first reference voltage to the drain of the first sense FET, and wherein the step of configuring the second sense FET includes coupling a second reference voltage to the source of the second sense FET.

* * * * *